(12) United States Patent
Hirano (10) Patent No.: US 7,755,962 B2
(45) Date of Patent: Jul. 13, 2010

(54) SEMICONDUCTOR MEMORY DEVICES, MEMORY SYSTEMS AND COMPUTING SYSTEMS INCLUDING THE SAME

(75) Inventor: Makoto Hirano, Yokohama (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 137 days.

(21) Appl. No.: 12/216,664

(22) Filed: Jul. 9, 2008

(65) Prior Publication Data

US 2009/0016132 A1    Jan. 15, 2009

(30) Foreign Application Priority Data

Jul. 9, 2007   (JP) .............................. 2007-180036
Mar. 12, 2008  (KR) ...................... 10-2008-0022988

(51) Int. Cl.
  *G11C 7/00* (2006.01)
(52) U.S. Cl. .................. 365/203; 365/189.09; 365/226
(58) Field of Classification Search ................ 365/203, 365/189.09, 189.11, 205, 207, 226
See application file for complete search history.

(56) References Cited

U.S. PATENT DOCUMENTS

| 7,057,944 | B2 * | 6/2006 | Ito et al. ................. | 365/189.15 |
| 7,164,601 | B2 * | 1/2007 | Mitani et al. ........... | 365/185.03 |
| 7,428,177 | B2 * | 9/2008 | Matsubara ............. | 365/189.09 |
| 7,466,592 | B2 * | 12/2008 | Mitani et al. ............. | 365/185.2 |

FOREIGN PATENT DOCUMENTS

JP    2000-173280    6/2000

* cited by examiner

*Primary Examiner*—Gene N. Auduong
(74) *Attorney, Agent, or Firm*—Harness, Dickey & Pierce, P.L.C.

(57) ABSTRACT

A semiconductor memory device includes a reference current generating circuit configured to generate a bias signal in response to a precharge signal during a precharge operation. Each of a plurality of sense amplifier circuits is connected to a corresponding one of a plurality of bit lines. Each sense amplifier is configured to precharge a corresponding bit line in response to the bias signal. The reference current generating circuit is configured to maintain the bias signal at a level higher than a voltage of the bit lines, but lower than a supply voltage during a sensing operation.

20 Claims, 8 Drawing Sheets

SEMICONDUCTOR MEMORY DEVICES, MEMORY SYSTEMS AND COMPUTING SYSTEMS INCLUDING THE SAME

PRIORITY STATEMENT

This U.S. non-provisional patent application claims priority under 35 U.S.C. §119 to Japanese Patent Application No. 2007-0180036 filed on Jul. 9, 2007 and Korean Patent Application No. 10-2008-0022988 filed on Mar. 12, 2008, the entire contents of both of which are hereby incorporated by reference.

BACKGROUND

Figure 1:
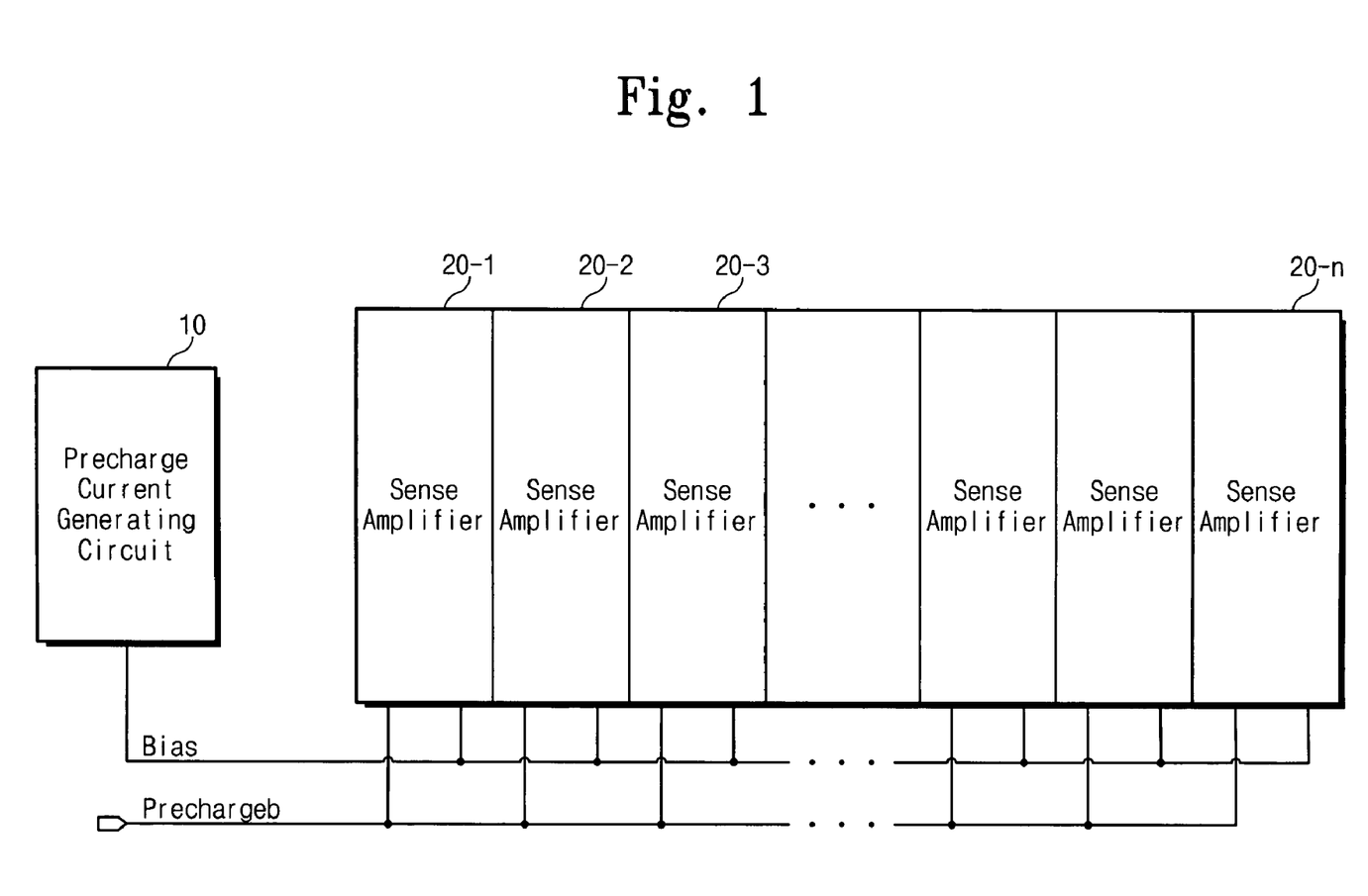
FIG. 1 is a block diagram illustrating a conventional read circuit.

FIG. 1 is a block diagram illustrating a conventional read circuit. Referring to FIG. 1, a conventional read circuit includes a precharge current generating circuit 10 and a plurality of sense amplifier circuits 20-1 to 20-n. The sense amplifier circuits 20-1 to 20-n receive a precharge bar signal 'Prechargeb' from a control circuit (not shown) of a semiconductor memory device, respectively. The precharge current generating circuit 10 generates a bias signal and provides the generated bias signal to the sense amplifier circuits 20-1 to 20-n, respectively.

Figure 2:
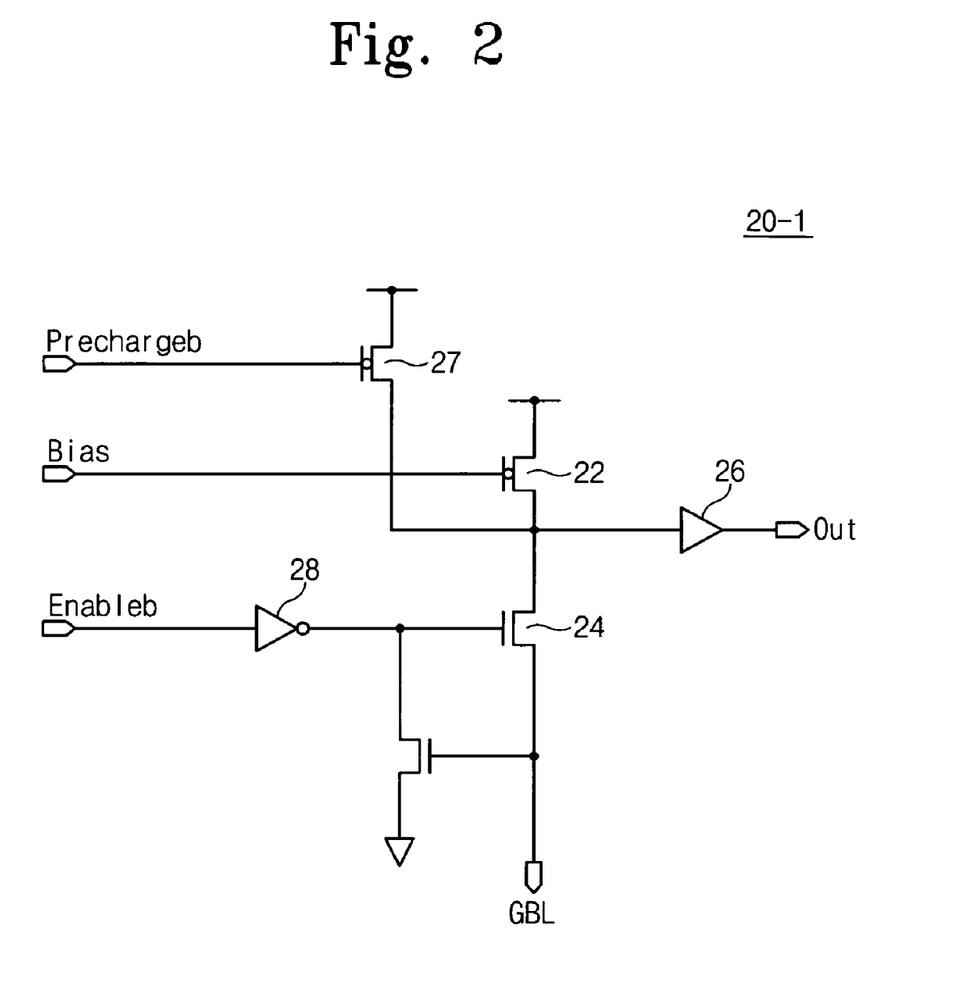
FIG. 2 is a circuit diagram of the conventional sense amplifier circuits shown in FIG. 1.

FIG. 2 is a circuit diagram of the conventional sense amplifier circuits 20-1 to 20-n shown in FIG. 1. Each of the conventional sense amplifier circuits 20-1 to 20-n may have the structure shown in FIG. 2.

Referring to FIG. 2, the source of a PMOS transistor 22 receives a supply voltage, and the gate of the PMOS transistor 22 receives a bias signal 'Bias'. The source of a PMOS transistor 27 receives the supply voltage, and the gate of the PMOS transistor 27 receives a precharge bar signal 'Prechargeb'. The drain of each of the PMOS transistors 22 and 27 is connected to an input terminal of an amplifier 26. The drain of an NMOS transistor 24 is connected to the input terminal of the amplifier 26. The gate of the NMOS transistor 24 is connected with an output terminal of an inverter 28. The inverter 28 inverts an enable bar signal 'Enableb'. The source of the NMOS transistor 24 is connected with a global bit line 'GBL'.

Figure 3:
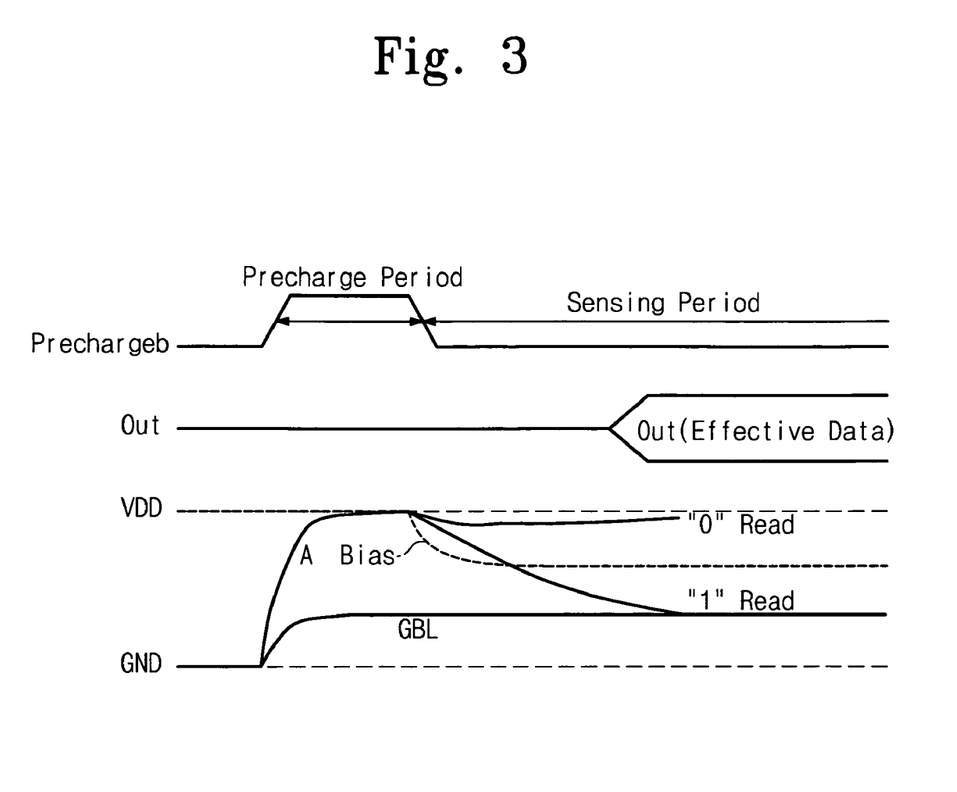
FIG. 3 is a timing diagram illustrating a conventional precharge operation of the sense amplifier circuit shown in FIG. 2.

FIG. 3 is a timing diagram illustrating a conventional precharge operation of the sense amplifier circuit shown in FIG. 2.

A conventional read operation of a general sense amplifier circuit will now be described with reference to FIGS. 2 and 3. During a conventional read operation, the inverter 28 inverts the input enable bar signal 'Enableb'. The inverted enable bar signal 'Enableb' is applied to the gate of the NMOS transistor 24. The NMOS transistor 24 is turned on by the inverted enable bar signal 'Enableb'. Because the NMOS transistor 24 is turned on, the global bit line 'GBL' is connected to the input terminal of the amplifier 26. During a precharge period, the precharge bar signal 'Prechargeb' is applied to the gate of the PMOS transistor 27 causing the PMOS transistor 27 to turn on. Because the PMOS transistor 27 is turned on, a node A of the input terminal of the amplifier 26 is charged to supply voltage VDD and the global bit line 'GBL' is charged to a given or predetermined level, as shown in FIG. 3.

After the precharge period ends, during a sensing period, bias signal "Bias' is applied to the gate of the PMOS transistor 22. While the bias signal is applied to the gate of the PMOS transistor 22, the voltage levels of the global bit line GBL and node A of the input terminal of the amplifier 26 are maintained by a turn-on current of the PMOS transistor 22. The voltage level of the bias signal 'Bias' is higher than that of the global bit line GBL, but lower than the supply voltage VDD.

Because each of the sense amplifier circuits 20-1 to 20-n shown in FIG. 1 includes the precharge PMOS transistor 27, the layout area of each of the sense amplifier circuits 20-1 to 20-n increases. Accordingly, the overall size of the memory device increases. In addition, a parasitic capacitance increases due to the precharge transistor, so that the read operation speed decreases.

SUMMARY

Example embodiments disclosed herein relate to semiconductor memory devices, memory systems and computing systems including the same. At least some example embodiments provide semiconductor memory devices capable of reducing chip size and/or realizing high speed sensing operations.

Example embodiments provide semiconductor memory devices including a reference current generating circuit and a plurality of sense amplifier circuits. The reference current generating circuit may generate a bias signal of ground level in response to a precharge signal during a precharge operation. The plurality of sense amplifier circuits may be connected with a plurality of bit lines, respectively. Each sense amplifier may precharge a corresponding bit line in response to the bias signal of ground level. The reference current generating circuit may maintain the bias signal of ground level at a level which is higher than a voltage of the bit lines, but lower than a supply voltage in a sensing operation.

At least one other example embodiment provides a memory system. The memory system may include a semiconductor memory device and a memory controller configured to control the semiconductor memory device. The semiconductor memory device may include a reference current generating circuit and a plurality of sense amplifier circuits. The reference current generating circuit may generate a bias signal of ground level in response to a precharge signal during a precharge operation. The plurality of sense amplifier circuits may be connected with a plurality of bit lines, respectively. Each sense amplifier may precharge a corresponding bit line in response to the bias signal of ground level. The reference current generating circuit may maintain the bias signal of ground level at a level which is higher than a voltage of the bit lines, but lower than a supply voltage in a sensing operation.

At least one other example embodiment provides a computing system. The computing system may include a microprocessor, a semiconductor memory device and a memory controller configured to control the semiconductor memory device according to a request from a micro-processor. The semiconductor memory device may include a reference current generating circuit and a plurality of sense amplifier circuits. The reference current generating circuit may generate a bias signal of ground level in response to a precharge signal during a precharge operation. The plurality of sense amplifier circuits may be connected with a plurality of bit lines, respectively. Each sense amplifier may precharge a corresponding bit line in response to the bias signal of ground level. The reference current generating circuit may maintain the bias signal of ground level at a level which is higher than a voltage of the bit lines, but lower than a supply voltage in a sensing operation.

According to at least some example embodiments, the reference current generating circuit may include a precharge control unit and a constant current source. The precharge control unit may generate the bias signal of ground level in response to the precharge signal. The constant current source may be connected between the precharge control unit and ground.

According to at least some example embodiments, during the sensing operation, the plurality of sense amplifier circuits may act as a node of a current mirror of the constant current source. The precharge control unit may include a first transistor and a second transistor. The first transistor may have a current path connected between the constant current source and the supply voltage. The second transistor may have a current path connected between a control terminal of the first transistor and the ground. The control terminal of the first transistor may be connected to the constant current source to receive the bias signal and a control terminal of the second transistor receives the precharge signal.

According to at least some example embodiments, during the precharge operation, the second transistor may generate the bias signal of ground level in response to the precharge signal. During the sensing operation, the first transistor may maintain the bias signal at a level which is higher than the voltage of the bit line, but lower than the supply voltage. Each of the plurality of sense amplifier circuits may include an amplifier and a third transistor connected between the supply voltage and an input terminal of the amplifier. The third transistor may also be mirror-connected with the first transistor. A fourth transistor may connect the bit line corresponding to the input terminal of the amplifier in response to the control signal.

According to at least some example embodiments, during the precharge operation, the third transistor may charge the input terminal of the amplifier to the supply voltage in response to the bias signal of the ground level and supplying the precharge current to the corresponding bit line. Each of the first and third transistors may be a PMOS transistor, whereas each of the second and fourth transistors may be an NMOS transistor. Alternatively, each of the first and third transistors may be an NMOS transistor. During the sensing operation, the plurality of sense amplifier circuits may sense and amplify data stored in selected memory cells through the corresponding bit lines.

According to at least some example embodiments, the may further include a cell array, a row selection circuit and a column selection circuit. The cell array may include a plurality of memory cells arranged at intersections of word lines and bit lines. The row selection circuit may be configured to select one or more word lines in response to a row address signal. The column selection circuit may be configured to select one or more bit lines of the cell array in response to column address signal. During the sensing operation, the plurality of sense amplifier circuits may sense and amplify data stored in memory cells corresponding to the selected one or more word lines and bit lines.

BRIEF DESCRIPTION OF THE FIGURES

The accompanying figures are included to provide a further understanding of example embodiments, and are incorporated in and constitute a part of this specification. The drawings illustrate example embodiments and, together with the description, serve to explain principles of the present invention. In the figures.

DETAILED DESCRIPTION OF EXAMPLE EMBODIMENTS

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 4:
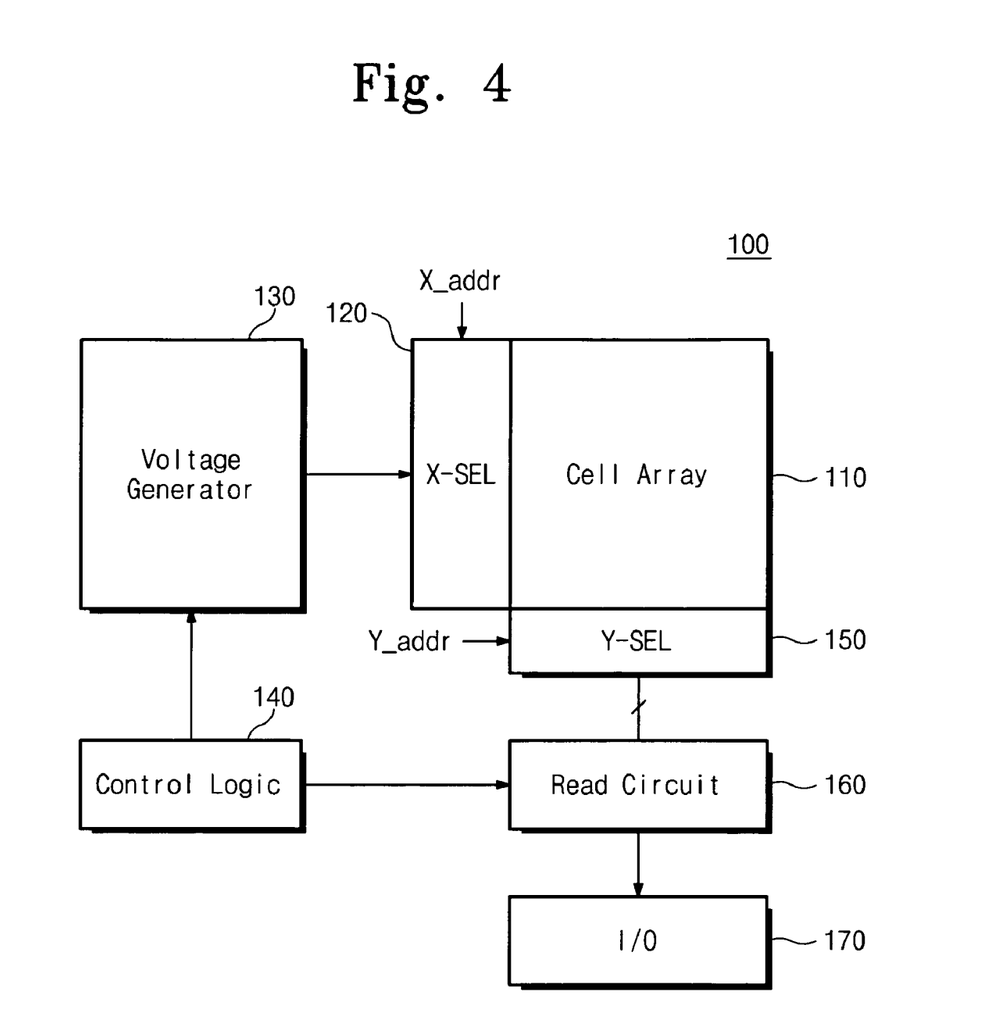
FIG. 4 is a block diagram of a semiconductor memory device according to an example embodiment.

FIG. 4 is a block diagram of a semiconductor memory device according to an example embodiment.

Referring to FIG. 4, an example embodiment of a semiconductor memory device 100 may include a cell array 110, a row selection circuit (represented as X-SEL in FIG. 4) 120, a voltage generator 130, a control logic (or controller) 140, a column selection circuit (represented as Y-SEL in FIG. 4) 150, a read circuit 160, and an input/output (I/O) device 170.

The cell array 110 may include a plurality of memory cells arranged at intersecting regions of word lines and bit lines. The row selection circuit 120 may select a word line in response to a row address X-addr.

During a read operation, the voltage generator 130 may generate a read voltage (or word line voltage) necessary for a read operation under the direction of the control logic 140. The generated read voltage may be applied to corresponding word lines by the row selection circuit 120.

Figure 5:
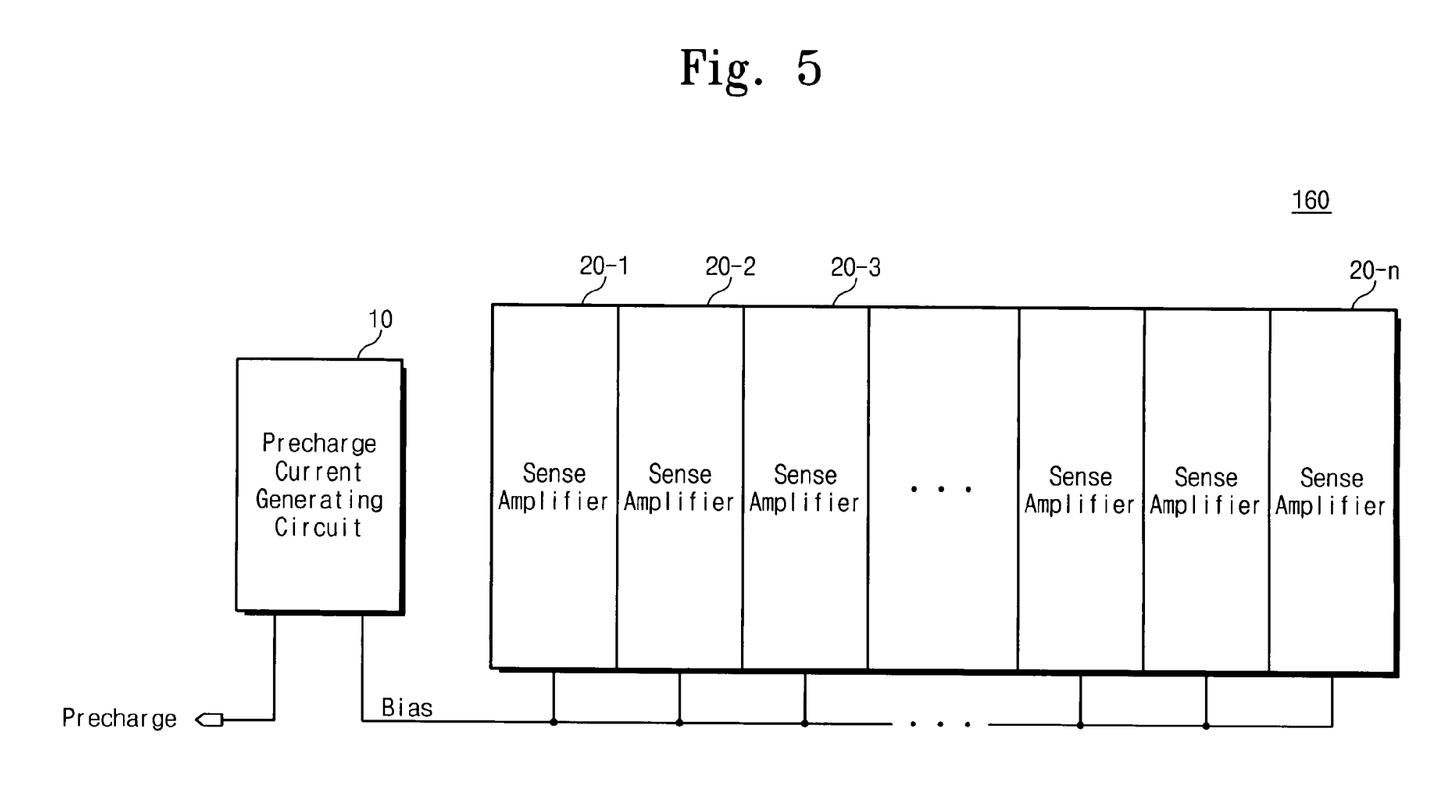
FIG. 5 is a block diagram of an example embodiment of a read circuit as shown in FIG. 4.

The read circuit 160 may include a plurality of sense amplifier circuits 20-1-20-n (shown in FIG. 5). Each of the plurality of sense amplifiers 20-1-20-n may correspond to one of a plurality of bit lines. The sense amplifier circuits 20-1-20-n may be connected to corresponding bit lines by the column selection circuit 150. During the read operation, the read circuit 160 may precharge the bit lines. After precharging the bit lines, the read circuit 160 may sense and amplify data stored in the selected memory cell. The sensed and amplified data may be output (externally) through the I/O device 170.

The control logic 140 may control operations (e.g., all or substantially all operations) of the semiconductor memory device 100.

The read circuit 160 may be constituted by a smaller number of transistors than that of the conventional read circuit of FIG. 1. Accordingly, the size of the read circuit 160 may be smaller than that of the conventional read circuit shown in FIG. 1. Because the size of the read circuit 160 is reduced, the memory chip size of the semiconductor memory device 100 according to example embodiments may be reduced. Because the memory chip size is reduced, an increase in the parasitic capacitance may be suppressed. Because increases in the parasitic capacitance are suppressed, the semiconductor memory device 100 may obtain a relatively high speed sensing operation.

Figure 6:
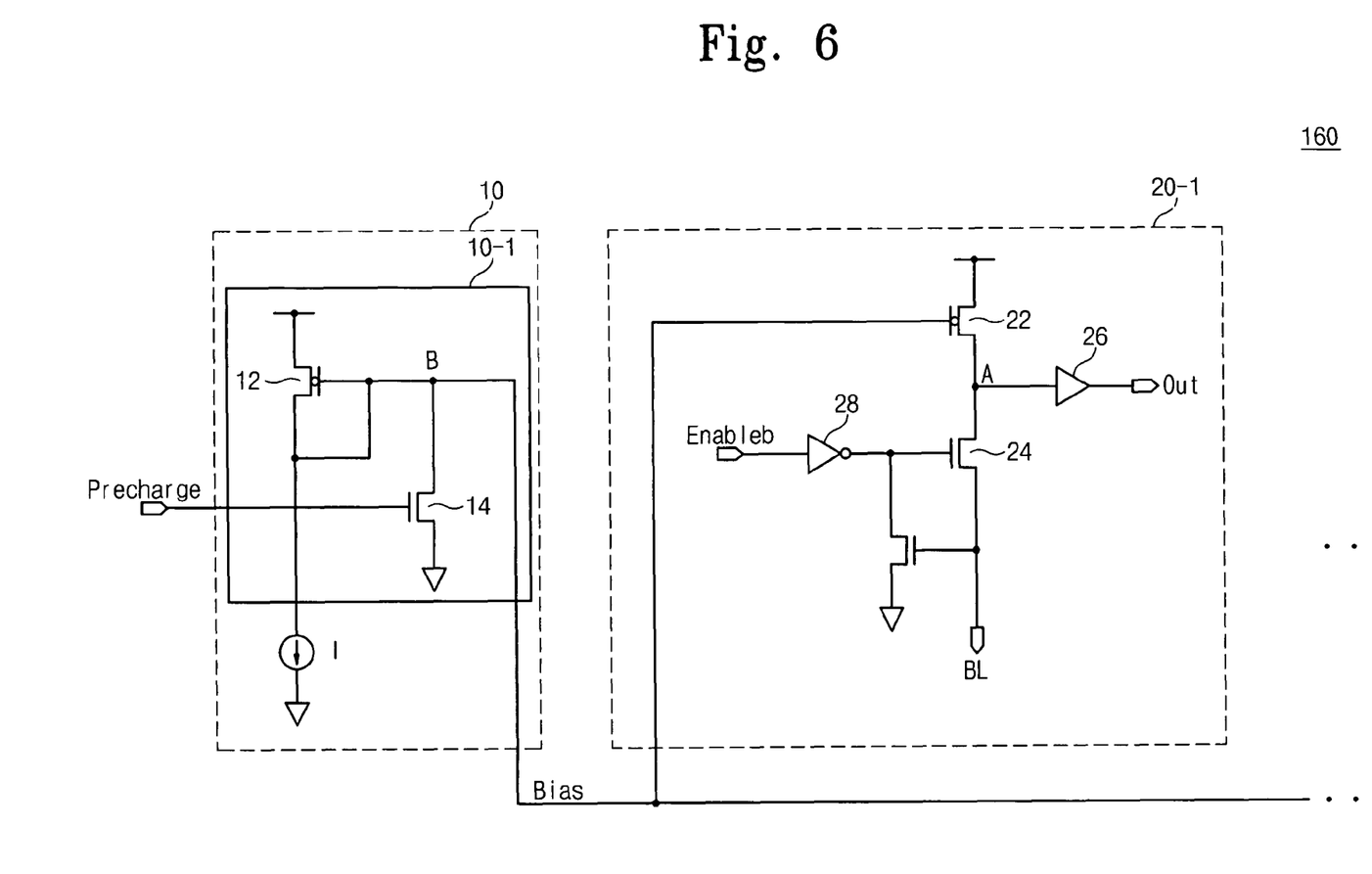
FIG. 6 is a circuit diagram illustrating example connections between the reference current generating circuit and the sense amplifier circuits shown in FIG. 5.

FIG. 5 is a block diagram of an example embodiment of the read circuit shown in FIG. 4. FIG. 6 is a circuit diagram illustrating example connections between the reference current generating circuit and the sense amplifier circuits shown in FIG. 5.

Referring to FIG. 5, the read circuit 160 may include a precharge (or reference) current generating circuit 10 and two or more sense amplifier circuits 20-1 to 20-n. In a precharge operation, the reference current generating circuit 10 may receive a precharge signal 'Precharge' from the control logic 140. The reference current generating circuit 10 may generate a bias signal 'Bias' (or reference current) having a low (L) level (e.g., ground level or 0 volts) in response to the received precharge signal 'Precharge' (which will be described below with reference to FIG. 6). The reference current generating circuit 10 may provide the generated bias signal 'Bias' to the sense amplifier circuits 20-1 to 2-n, respectively.

Each of the sense amplifier circuits 20-1 to 20-n may supply the precharge current to a corresponding bit line in response to the bias signal 'Bias' provided from the reference current generating circuit 10. In doing so, the sense amplifier circuits 20-1 to 20-n may initiate a precharge operation to supply the precharge current to corresponding bit lines. The sense amplifier circuits 20-1 to 20-n may function as a node of a current mirror of a constant current source in a subsequent sensing period.

During a sensing operation, the reference current generating circuit 10 may maintain the bias signal 'Bias' at a level higher than a voltage of the bit line BL, but lower than the supply voltage VDD, for example between a voltage of the bit line BL and the supply voltage VDD.

The reference current generating circuit 10 may include a precharge control unit 10-1 and a constant current generating unit I. The precharge control unit 10-1 may include a first (e.g., PMOS) transistor 12 and a second (e.g., NMOS) transistor 14. The first transistor 12 of the precharge control unit 10-1 may be mirror-connected with respect to a current bias (e.g., PMOS) transistor 22 (also referred to as third transistor 22) of a corresponding sense amplifier circuit 20-1. The second transistor 14 may set the level of a node B to a low level. For example, the second transistor 14 may generate a bias signal 'Bias' having a low level. The sense amplifier circuit 20-1 may initiate a precharge operation in response to the bias signal 'Bias' having a low level.

The source of the first transistor 12 may be connected to a supply voltage, and the gate of the first transistor 12 may be connected to its drain and the drain of the second transistor 14. The drain of the first transistor 12 may also be connected to a drain (not shown) of an active transistor for a mirror operation. The gate of the first transistor 12 may be connected to a gate of a third transistor 22 of each of the sense amplifier circuits 20-1 to 20-n. The gate of the second transistor 14 may receive a precharge signal 'Precharge' and the source of the second transistor 14 may be connected to ground.

The source of the third transistor 22 of the sense amplifier circuit 20-1 may be connected with the supply voltage. The gate of the third transistor 22 may be connected to the gate of the first transistor 12, and the drain of the transistor 22 may be connected with an input terminal of the amplifier 26. The drain of the fourth (e.g., NMOS) transistor 24 may be connected with the input terminal of the amplifier 26. The gate of the fourth transistor 24 may be connected with an output terminal of an inverter 28. The inverter 28 may invert an enable bar signal 'Enableb'. The source of the fourth transistor 24 may be connected with a bit line BL.

Figure 7:
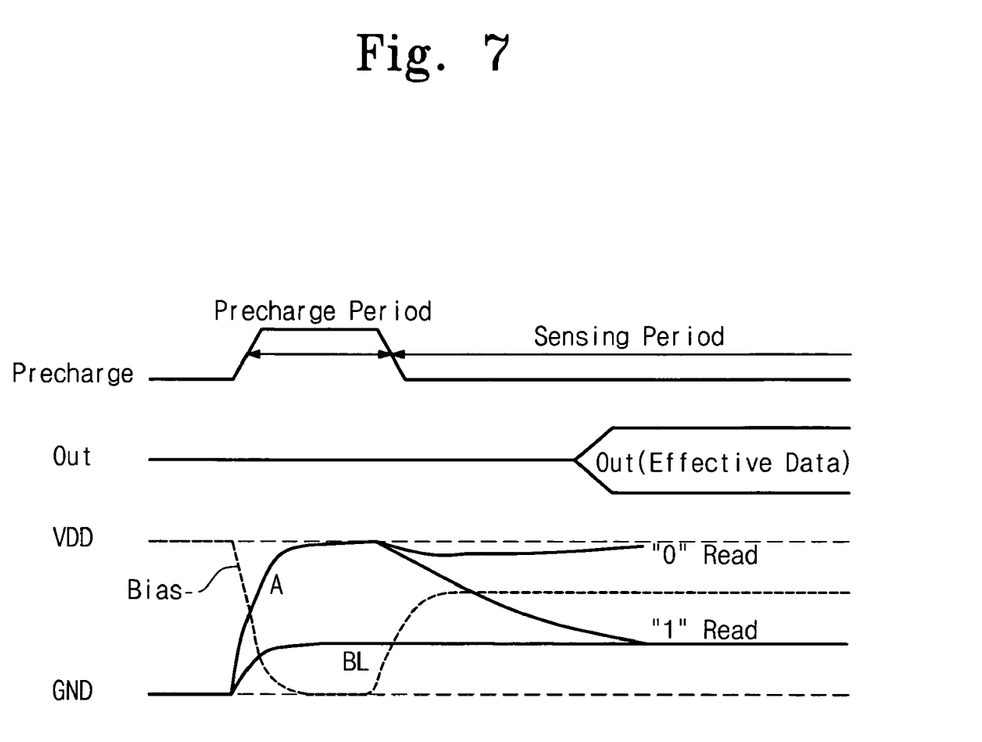
FIG. 7 is a timing diagram illustrating a precharge operation of a sense amplifier circuit according to an example embodiment.

FIG. 7 is a timing diagram illustrating a precharge operation of a sense amplifier circuit according to an example embodiment.

An example read operation of the sense amplifier circuit 20-1 will now be described with reference to FIGS. 5 and 7. The inverter 28 may invert the input enable bar signal 'Enableb'. The inverted enable bar signal 'Enableb' may be input into the gate of the fourth transistor 24. The fourth transistor 24 may be turned on in response to the inverted enable bar signal 'Enableb'. Because the fourth transistor 24 is turned on, the bit line BL may be connected with the input terminal of the amplifier 26.

During a precharge operation (or precharge period), precharge signal 'Precharge' may be input into the gate of the second transistor 14 of the precharge control unit 10-1. The second transistor 14 may be turned on by the precharge signal 'Precharge', and a potential of node B of the gate of the PMOS transistor 12 may become a low (L) level. As a result, a bias signal 'Bias' having a logic low level may be generated. The bias signal 'Bias' having a low level may be applied to the transistor 22 of the sense amplifier circuit 20-1. because the third transistor 22 and the first transistor 12 have a mirror relationship, the gate of the first transistor 12 may also receive the bias signal 'Bias'. The transistor 22 may be turned on by the bias signal 'Bias' having a low level. Because the third transistor 22 is turned on, node A of the input terminal of the amplifier 26 may charge to the supply voltage VDD as shown in FIG. 7. Also, the bit line BL may charge to a given, desired or given, desired or predetermined level as shown in FIG. 7.

After the precharge operation ends, the second transistor 14 may be turned off by the precharge signal 'Precharge' having a low level, and the bias signal 'Bias' may be maintained at a given, desired or predetermined level by the first transistor 12. The level of the bias signal 'Bias' may be maintained at a level higher than the voltage level of the bit line BL, but lower than the supply voltage VDD, for example between the voltage level of the bit line BL and the supply voltage VDD.

During a sensing operation (or sensing period), the sense amplifier circuit 20-1 may function as a node of a current mirror of a constant current source. Because the bias signal 'Bias' applied to the gate of the first transistor 12 and the gate of the transistor 22 is elevated to a potential fixed by the mirror connection, the level of the bit line BL and the level of the input terminal of the amplifier 26 may be maintained. The amplifier 26 of the sense amplifier circuit 20-1 may fix an output level in response to the level of a signal read out of the bit line BL to output the output signal of "0" or "1" (logic low "L" or logic high "H") through the output terminal 'Out'. For example, the sense amplifier circuit 20-1 may sense and amplify data stored in a memory cell through the bit line BL.

It will be apparent to those skilled in the art that the first transistor 12 and the third transistor 22, which may be mirror-connected with each other, may be constituted by NMOS transistors.

The potential of the node B of the gate of the first transistor 12 may be decreased to a negative potential level lower than the low (L) level. When the potential of the node B is decreased to a negative potential level, a potential difference Vgs between gate and source of the third transistor 22 may increase. By performing the above operation, a current necessary for charging the bit line BL and the node A of the input terminal of the amplifier 26 may be obtained.

According to the aforementioned example embodiments, the number of the elements constituting each of the sense amplifier circuits 20-1 to 20-n in the semiconductor memory device 100 may be decreased. As a result, the size of the sense amplifier circuits 20-1 to 20-n may be decreased and/or minimized. The decreased size may suppress increases in a parasitic capacitance. Because the increase in the parasitic capacitance is suppressed, a relatively high speed precharge operation may be performed. Semiconductor memory devices according to example embodiments may reduce memory chip size and/or realize relatively high speed sensing operation.

Figure 8:
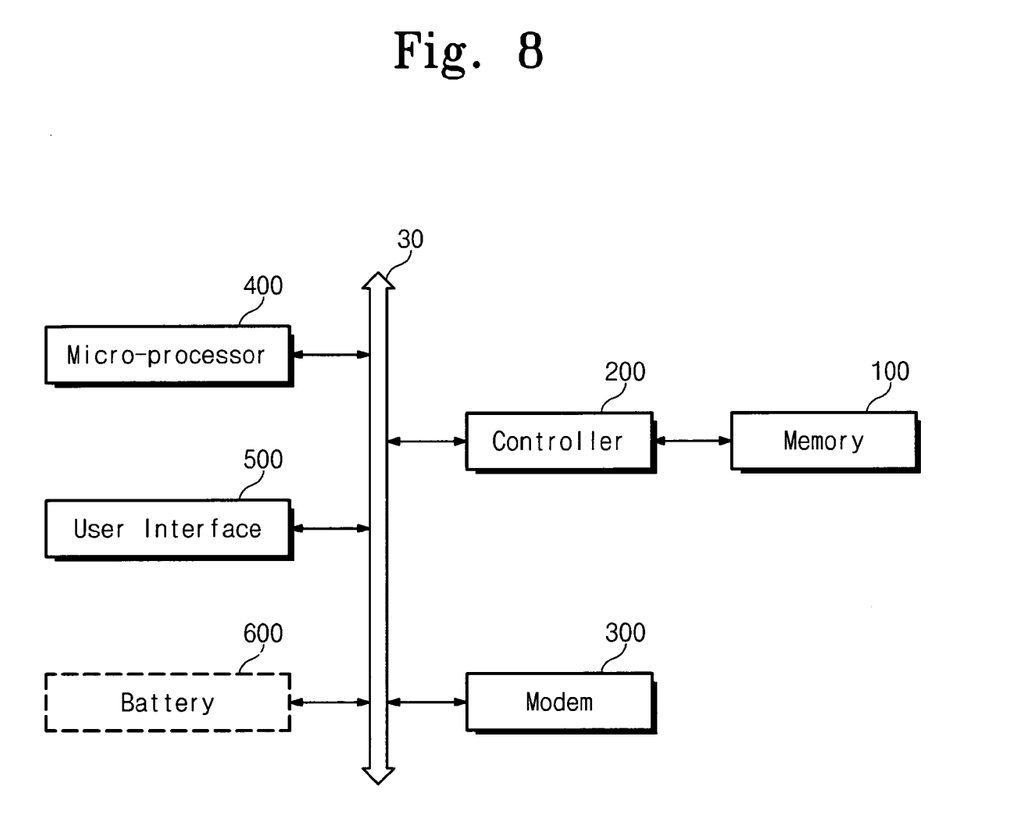
FIG. 8 is a schematic view illustrating a computing system including a semiconductor memory device according to an example embodiment.

FIG. 8 is a schematic view illustrating a computing system including a semiconductor memory device according to an example embodiment.

The semiconductor memory device represents a nonvolatile memory device (e.g., flash memory or the like) capable of maintaining data stored therein even when power is cut off. These semiconductor memory devices are more widely used as code storages as well as data storages as the use of mobile devices, such as cellular phone, smart phone, personal digital assistant (PDA), digital camera, portable game console, MP3 player, laptop computer, etc. increases. These semiconductor memory devices may be also used in home applications, such as desktop or laptop computers, high definition televisions (HDTV)s, digital video disc (DVD) players, routers, global positioning signal (GPS) devices, navigation systems, etc. A computing system including the semiconductor memory device 100 according to an example embodiment is schematically shown in FIG. 8.

Referring to FIG. 8, the computing system may include a micro-processor 400, a user interface 500, a modem 300 such as a baseband chipset, a memory controller 200, which are electrically connected with a bus 30, and the semiconductor memory device 100.

The memory controller 200 and the semiconductor memory device 100 may constitute a memory system. The semiconductor memory device 100 may have the same or substantially same construction as the example embodiment shown in FIG. 4. In this example embodiment, N bit(s) data (where N is an integer greater than or equal to 1) processed (or to be processed) by the micro-processor 400 may be stored in the semiconductor memory device 100.

In the example in which the computing system is a mobile device (e.g., a cellular phone, smart phone, PDA, digital camera, portable game console, MP3 player, laptop computer, etc.), the computing system may further include a battery 600 for supplying an operating voltage of the computing system. Although not shown in the drawings, it will be apparent to those skilled in the art that the computing system according to an example embodiment may further include an application chipset, a camera image processor (CIS), a mobile dynamic random access memory (DRAM) or the like.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory device comprising:
    a reference current generating circuit configured to generate a bias signal in response to a precharge signal during a precharge operation; and
    a plurality of sense amplifier circuits, each of the plurality of sense amplifier circuits being connected to a corresponding one of a plurality of bit lines, each of the plurality of sense amplifier circuits being configured to precharge a corresponding bit line in response to the bias signal; wherein
    the reference current generating circuit is further configured to maintain the bias signal at a level higher than a voltage of the plurality of bit lines, but lower than a supply voltage, during a sensing operation.

2. The semiconductor memory device of claim 1, wherein the reference current generating circuit includes,
    a precharge control circuit configured to generate the bias signal in response to the precharge signal, and a constant current source connected between the precharge control circuit and ground.

3. The semiconductor memory device of claim 2, wherein during the sensing operation, the plurality of sense amplifier circuits act as a node of a current mirror of the constant current source.

4. The semiconductor memory device of claim 2, wherein the precharge control circuit includes,
    a first transistor connected between the constant current source and the supply voltage, and
    a second transistor connected between a control terminal of the first transistor and ground, wherein
        the control terminal of the first transistor is connected with the constant current source to receive the bias signal, and
        a control terminal of the second transistor receives the precharge signal.

5. The semiconductor memory device of claim 4, wherein during the precharge operation, the second transistor generates the bias signal in response to the precharge signal.

6. The semiconductor memory device of claim 4, wherein during the sensing operation, the first transistor maintains the bias signal at a level higher than the voltage of a corresponding bit line, but lower than the supply voltage.

7. The semiconductor memory device of claim 4, wherein each of the plurality of sense amplifier circuits includes,
    an amplifier,
    a third transistor connected between the supply voltage and an input terminal of the amplifier, the third transistor being mirror-connected with the first transistor, and
    a fourth transistor connecting a bit line to the input terminal of the amplifier in response to the control signal.

8. The semiconductor memory device of claim 7, wherein during the precharge operation, the third transistor charges the input terminal of the amplifier to the supply voltage in response to the bias signal, and supplies the precharge current to the corresponding bit line.

9. The semiconductor memory device of claim 7, wherein each of the first and third transistors are PMOS transistors.

10. The semiconductor memory device of claim 7, wherein each of the second and fourth transistors are NMOS transistors.

11. The semiconductor memory device of claim 7, wherein each of the first and third transistors are NMOS transistors.

12. The semiconductor memory device of claim 1, wherein during the sensing operation, the plurality of sense amplifier circuits sense and amplify data stored in selected memory cells through the corresponding bit lines.

13. The semiconductor memory device of claim 1, further comprising:
    a cell array including a plurality of memory cells arranged at intersections of word lines and bit lines;
    a row selection circuit configured to select one or more word lines in response to a row address signal; and
    a column selection circuit configured to select one or more bit lines of the cell array in response to column address signal; wherein
        during the sensing operation, the plurality of sense amplifier circuits sense and amplify data stored in memory cells corresponding to the selected one or more word lines and bit lines.

14. A memory system comprising:
    the semiconductor memory device of claim 1; and
    a memory controller configured to control the semiconductor memory device.

15. The memory system of claim 14, wherein the reference current generating circuit includes,
    a precharge control circuit configured to generate the bias signal in response to the precharge signal, and
    a constant current source connected between the precharge control circuit and ground.

16. The memory system of claim 15, wherein the precharge control circuit includes,
    a first transistor connected between the constant current source and the supply voltage, and
    a second transistor connected between a control terminal of the first transistor and ground, wherein
        the control terminal of the first transistor is connected with the constant current source to receive the bias signal, and
        a control terminal of the second transistor receives the precharge signal.

17. The memory system of claim 16, wherein each of the plurality of sense amplifier circuits includes,
    an amplifier,
    a third transistor connected between the supply voltage and an input terminal of the amplifier, the third transistor being mirror-connected with the first transistor, and
    a fourth transistor connecting a bit line to the input terminal of the amplifier in response to the control signal.

18. The memory system of claim 14, further comprising:
    a cell array including a plurality of memory cells arranged at intersections of word lines and bit lines;
    a row selection circuit configured to select one or more word lines in response to a row address signal; and
    a column selection circuit configured to select one or more bit lines of the cell array in response to column address signal; wherein
        during the sensing operation, the plurality of sense amplifier circuits sense and amplify data stored in memory cells corresponding to the selected one or more word lines and bit lines.

19. A computing system comprising:
    a micro-processor;
    the semiconductor memory device of claim 1; and
    a memory controller configured to control the semiconductor memory device according to a request from a micro-processor.

20. The computing system of claim 19, wherein the reference current generating circuit includes,
    a precharge control circuit configured to generate the bias signal in response to the precharge signal, and
    a constant current source connected between the precharge control circuit and ground.

* * * * *